(12) United States Patent
Lee

(10) Patent No.: US 9,773,204 B2
(45) Date of Patent: Sep. 26, 2017

(54) NEUROMORPHIC DEVICE INCLUDING SYNAPSES HAVING CARRIER TRAPS DISTRIBUTED AT MULTIPLE ENERGY LEVELS

(71) Applicant: SK hynix Inc., Icheon (KR)

(72) Inventor: Hyung-Dong Lee, Icheon (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/386,965

(22) Filed: Dec. 21, 2016

(65) Prior Publication Data

US 2017/0193357 A1    Jul. 6, 2017

Related U.S. Application Data

(60) Provisional application No. 62/273,236, filed on Dec. 30, 2015.

(30) Foreign Application Priority Data

Oct. 17, 2016 (KR) .................. 10-2016-0134231

(51) Int. Cl.
*H01L 47/00* (2006.01)
*G06N 3/063* (2006.01)
*H01L 45/00* (2006.01)

(52) U.S. Cl.
CPC ....... *G06N 3/0635* (2013.01); *H01L 45/1233* (2013.01); *H01L 45/1253* (2013.01); *H01L 45/14* (2013.01)

(58) Field of Classification Search
CPC . H01L 45/1233; H01L 45/1253; H01L 45/14; G06N 3/049; G06N 3/0635
USPC .............................................................. 257/4
See application file for complete search history.

(56) References Cited

U.S. PATENT DOCUMENTS

| 8,463,723 B2 | 6/2013 | Modha et al. | |
| 8,605,483 B2 | 12/2013 | Williams et al. | |
| 2014/0067743 A1* | 3/2014 | Park | G06N 3/049 |
| | | | 706/33 |
| 2016/0133317 A1* | 5/2016 | Lee | G11C 11/54 |
| | | | 257/314 |

* cited by examiner

*Primary Examiner* — Brook Kebede

(57) ABSTRACT

A neuromorphic device having synapses may include: a top electrode; a bottom electrode; and a variable resistive layer disposed between the top electrode and the bottom electrode. The variable resistive layer may include a plurality of carrier traps distributed at multiple energy levels.

20 Claims, 14 Drawing Sheets

NEUROMORPHIC DEVICE INCLUDING SYNAPSES HAVING CARRIER TRAPS DISTRIBUTED AT MULTIPLE ENERGY LEVELS

CROSS-REFERENCE TO RELATED APPLICATIONS

The present application claims priorities of U.S. Provisional Patent Application No. 62/273,236, filed on Dec. 30, 2015, and Korean Patent Application No. 10-2016-0134231, filed on Oct. 17, 2016, which are incorporated herein by reference in their entirety.

BACKGROUND

1. Field

Exemplary embodiments of the present application relate to a neuromorphic device, and more particularly, to a neuromorphic device including synapses having carrier traps distributed at multiple energy levels.

2. Description of the Related Art

Recently, much attention has been paid to neuromorphic technology, which uses chips that mimic the human brain. A neuromorphic device based on the neuromorphic technology includes a plurality of pre-synaptic neurons, a plurality of post-synaptic neurons, and a plurality of synapses. The neuromorphic device outputs pulses or spikes having various levels, amplitudes, or times, according to learning states of the neuromorphic device. The synapses may gradually change to a high resistance state or a low resistance state depending on learning states of the synapses.

SUMMARY

Various embodiments are directed to a neuromorphic device including synapses, each of the synapses including a variable resistive layer having multiple resistance levels.

Also, various embodiments are directed to a neuromorphic device including synapses, each of the synapses including a variable resistive layer that has a plurality of carrier traps distributed at multiple energy levels.

In an embodiment, a neuromorphic device having synapses may include: a top electrode; a bottom electrode; and a variable resistive layer disposed between the top electrode and the bottom electrode. The variable resistive layer may include a plurality of carrier traps distributed at multiple energy levels.

The neuromorphic device may further include an upper blocking layer disposed between the top electrode and the variable resistive layer.

The upper blocking layer may include a semiconductor material that substantially lacks carrier traps.

The neuromorphic device may further include a lower blocking layer disposed between the bottom electrode and the variable resistive layer.

The lower blocking layer and the variable resistive layer may include two or more of the same materials.

The neuromorphic device may further include an upper barrier layer disposed between the top electrode and the variable resistive layer.

The upper barrier layer may include one or more of titanium (Ti), tantalum (Ta), titanium nitride (TiN), tantalum nitride (TaN), tungsten nitride (WN) and another barrier material.

The neuromorphic device may further include a lower barrier layer disposed between the bottom electrode and the variable resistive layer.

The variable resistive layer may include two or more of silicon (Si), germanium (Ge), gallium (Ga), indium (In), arsenic (As), stibium (Sb), hafnium (Hf), tantalum (Ta), titanium (Ti), zirconium (Zr), lanthanum (La), vanadium (V), chrome (Cr), manganese (Mn), rubidium (Ru), strontium (Sr), yttrium (Y), niobium (Nb), molybdenum (Mo), ruthenium (Ru), iridium (Ir), aluminum (Al), silicon-germanium ($Si_xGe_y$) and an oxide thereof.

The plurality of carrier traps may include charge traps or dangling bonds at an interface between two or more materials, or dangling bonds in an amorphous material.

The plurality of carrier traps may include low carrier traps and high carrier traps. The low carrier traps may be distributed at relatively low energy levels among the multiple energy levels. The high carrier traps may be distributed at relatively high energy levels among the multiple energy levels.

A density of the high carrier traps may be higher than a density of the low carrier traps.

The plurality of carrier traps may be distributed between the Fermi level and the valence band.

In an embodiment, a neuromorphic device may include: a row line; a column line; and a synapse disposed between the row line and the column line. The synapse may include a variable resistive layer and a blocking layer in direct contact with the variable resistive layer, and the variable resistive layer may include a semiconducting material having a plurality of carrier traps distributed at multiple energy levels.

The plurality of carrier traps may correspond to defects based on an atomic combination within the variable resistive layer.

The blocking layer may include two or more materials that may be the same as materials of the variable resistive layer.

The neuromorphic device may further include a barrier layer in direct contact with the blocking layer.

Each of the row line, the column line, and the barrier layer may include a conductive material having at least one of metals or metal compounds.

The plurality of carrier traps may include low carrier traps and high carrier traps. The low carrier traps may be distributed at relatively low energy levels among the multiple energy levels. The high carrier traps may be distributed at relatively high energy levels among the multiple energy levels.

A density of the high carrier traps may be higher than a density of the low carrier traps.

DETAILED DESCRIPTION

Figure 1:
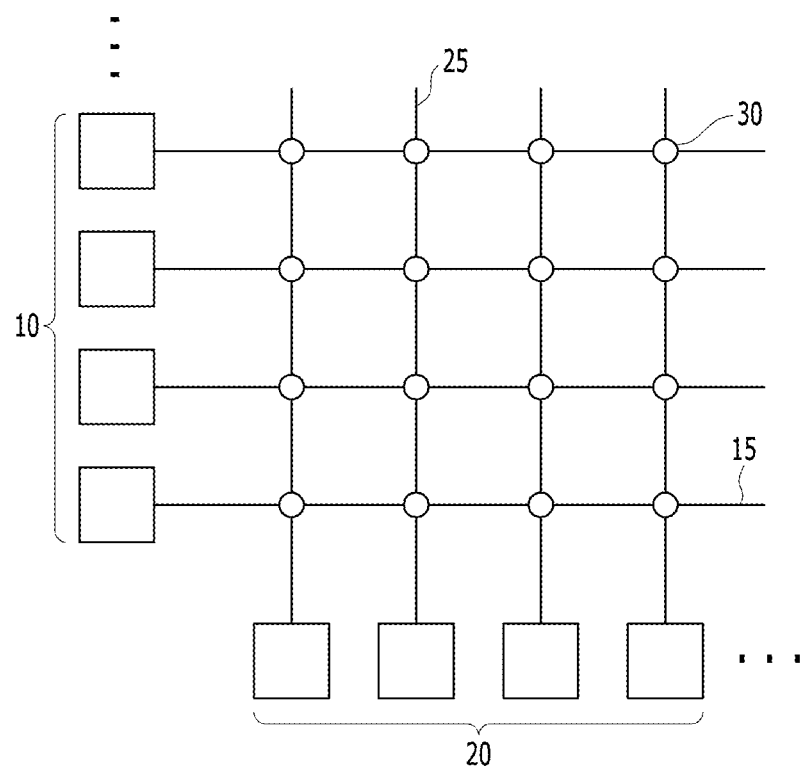
FIG. 1 is a block diagram conceptually illustrating a neuromorphic device in accordance with an embodiment.

Various embodiments will be described below in more detail with reference to the accompanying drawings. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art.

The terms used in this specification are used for describing exemplary embodiments without limiting the inventive concepts. The terms of a singular form may include plural forms unless referred to the contrary. The meaning of 'comprise' and 'comprising' used in the specification specifies a component, step, operation, and/or element but does not exclude other components, steps, operations, and/or elements.

When one element is referred to as being 'connected to' or 'coupled to' another element, it may indicate that the former element is directly connected or coupled to the latter element or another element is interposed therebetween. On the other hand, when one element is referred to as being 'directly connected to' or 'directly coupled to' another element, it may indicate that no element is interposed therebetween. Furthermore, 'and/or' includes each of described items and one or more combinations.

The terms such as 'below', 'beneath', 'lower', 'above' and 'upper', which are spatially relative terms, may be used to easily describe the correlation between one element or components and another element or other components as illustrated in the drawings. The spatially relative terms should be understood as terms including different directions of elements during use or operation, in addition to directions illustrated in the drawings. For example, when an element illustrated in the drawings is turned over, the element which is referred to as being 'below' or 'beneath' another element may be placed above another element.

Moreover, exemplary embodiments of this specification will be described with reference to sectional views and/or plan views which are ideal exemplary views of the inventive concepts. In the drawings, the dimensions of layers and regions may be exaggerated for clarity of illustration. Thus, the shapes of the exemplary views may be modified according to the manufacturing technique and/or allowable errors. Therefore, the present embodiments are not limited to specific shapes illustrated in the drawings, but may include other shapes that are created depending on a fabrication process. For example, an angled region may have a rounded shape or a predetermined curvature. Therefore, regions exemplified in the drawings have general properties, and the shapes of the regions are used for illustrating a specific shape of a device region. Thus, this should not be construed as limited to the scope of the inventive concepts.

Throughout the specification, like reference numerals denote the same elements. Therefore, although the same or similar reference numerals are not mentioned or described in the corresponding drawing, the reference numerals may be described with reference to other drawings. Furthermore, although elements are not represented by reference numerals, the elements may be described with reference to other drawings.

FIG. 1 is a block diagram conceptually illustrating a neuromorphic device in accordance with an embodiment of the present disclosure. Referring to FIG. 1, the neuromorphic device in accordance with the embodiment may include a plurality of pre-synaptic neurons 10, a plurality of post-synaptic neurons 20, and a plurality of synapses 30. Each of the synapses 30 may be arranged at an intersection between a row line 15 extending in a first direction from a corresponding one of the pre-synaptic neurons 10 and a column line 25 extending in a second direction from a corresponding one of the post-synaptic neurons 20, the first direction crossing the second direction.

The pre-synaptic neurons 10 may transmit electrical signals to the synapses 30 through the row lines 15 in a learning mode, a reset mode, or a reading mode.

The post-synaptic neurons 20 may transmit or receive electrical signals to or from the synapses 30 through the column lines 25 in the learning mode or the reset mode, and may receive electrical signals from the synapses 30 through the column lines 25 in the reading mode.

Each of the synapses 30 may include a bipolar device such as a variable resistive device. For example, each of the synapses 30 may include a first electrode electrically coupled to a corresponding one of the pre-synaptic neurons 10 and a second electrode electrically coupled to a corresponding one of the post-synaptic neurons 20. The synapse 30 may have multiple resistance levels. The synapse 30 may be gradually changed to a high-resistance state or a low-resistance state according to the number of electrical signals received from the pre-synaptic neuron 10 and/or the post-synaptic neuron 20, a time difference between the electrical signals being received, and/or a voltage difference between the electrical signals.

Figure 2:
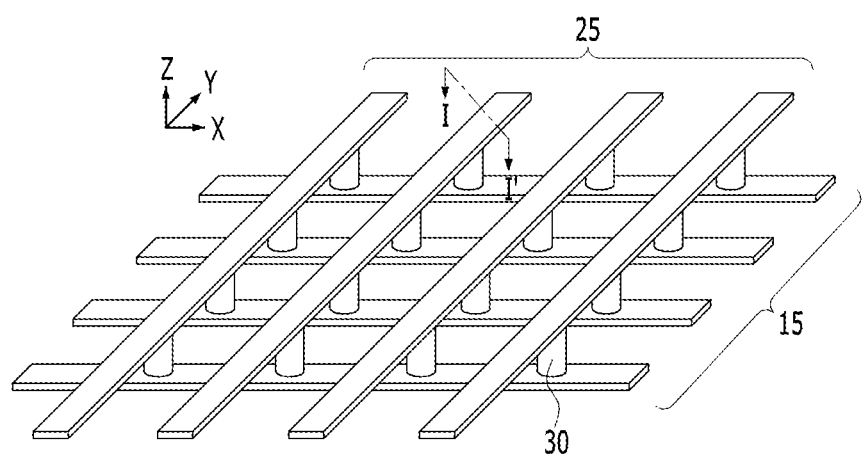
FIG. 2 is a perspective view conceptually illustrating a neuromorphic device in accordance with an embodiment.

FIG. 2 is a perspective view conceptually illustrating a neuromorphic device in accordance with an embodiment. Referring to FIG. 2, the neuromorphic device in accordance with the present embodiment may include row lines 15, column lines 25, and synapses 30. Each of the row lines 15 may have a line shape extending in an X-direction. Each of the column lines 25 may have a line shape extending in a Y-direction. The X-direction and the Y-direction may be perpendicular to each other. The synapses 30 may be arranged at respective intersections between the row lines 15 and the column lines 25 when seen from above.

FIGS. 3A to 3D are conceptual cross-sectional views of synapses 30A to 30D of neuromorphic devices in accordance with various embodiments, taken along line I-I' of FIG. 2.

Figure 3A:
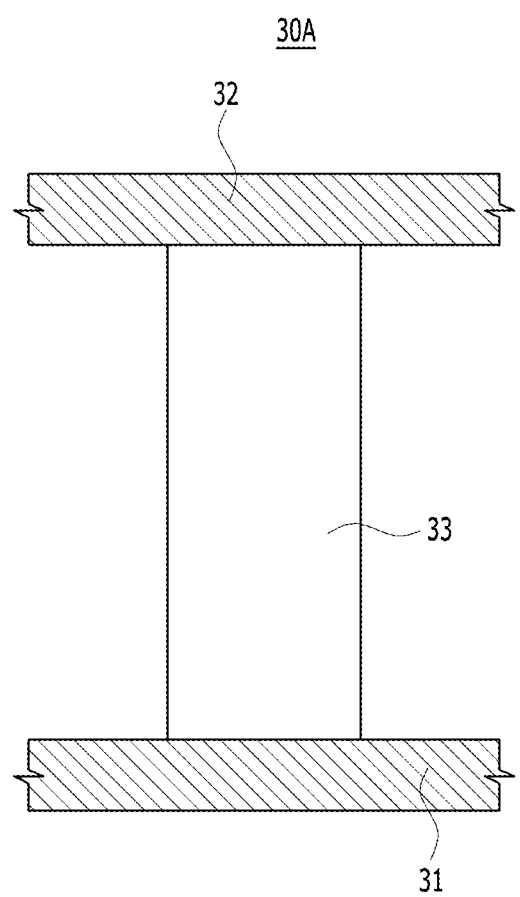
FIGS. 3A to 3D are conceptual cross-sectional views of synapses of neuromorphic devices in accordance with various embodiments, taken along line I-I' of FIG. 2.

Referring to FIG. 3A, the synapse 30A may include a bottom electrode 31, a top electrode 32, and a variable resistive layer 33 disposed between the bottom electrode 31 and the top electrode 32. Referring to FIG. 2, the bottom electrode 31 may correspond to the row line 15, and the top electrode 32 may correspond to the column line 25.

The bottom electrode 31 and the top electrode 32 may include a conductive layer formed of a metal such as tungsten (W), copper (Cu), nickel (Ni), or aluminum (Al); or a metal nitride such as tungsten nitride (WN), titanium nitride (TiN), tantalum nitride (TaN), or aluminum nitride (AlN). In other embodiments, the bottom electrode 31 and the top electrode 32 may include a silicide material such as tungsten silicide (WSi), titanium silicide (TiSi), or cobalt silicide (CoSi).

The variable resistive layer 33 may include a semiconductor material having a plurality of carrier traps, such as charge traps or nano traps. For example, the variable resistive layer 33 may include two or more of silicon (Si), germanium (Ge), gallium (Ga), indium (In), arsenic (As), stibium (Sb), hafnium (Hf), tantalum (Ta), titanium (Ti), zirconium (Zr), lanthanum (La), vanadium (V), chrome (Cr), manganese (Mn), rubidium (Ru), strontium (Sr), yttrium (Y), niobium (Nb), molybdenum (Mo), ruthenium (Ru), iridium (Ir), aluminum (Al), silicon-germanium ($Si_xGe_y$), and so on. The variable resistive layer 33 may include at least one of the semiconductor materials listed above and at least one oxide of one of the semiconductor materials listed above. In other embodiments, the variable resistive layer 33 may include an oxide including at least two of the above listed materials. For example, the variable resistive layer 33 may include an $A_xB_yO_z$-based material, where x, y, and z represent positive real numbers. In some embodiments, the variable resistive layer 33 may include a compound of at least three kinds of metals, semiconductor materials, insulating materials, or combinations thereof.

The carrier traps may include defects based on an atomic combination in the variable resistive layer 33. For example, the carrier traps may be generated by charge traps or dangling bonds at an interface between two materials, dangling bonds in an amorphous material, a difference in the number of outermost electrons between the two materials, or a substitution of materials.

Figure 3B:
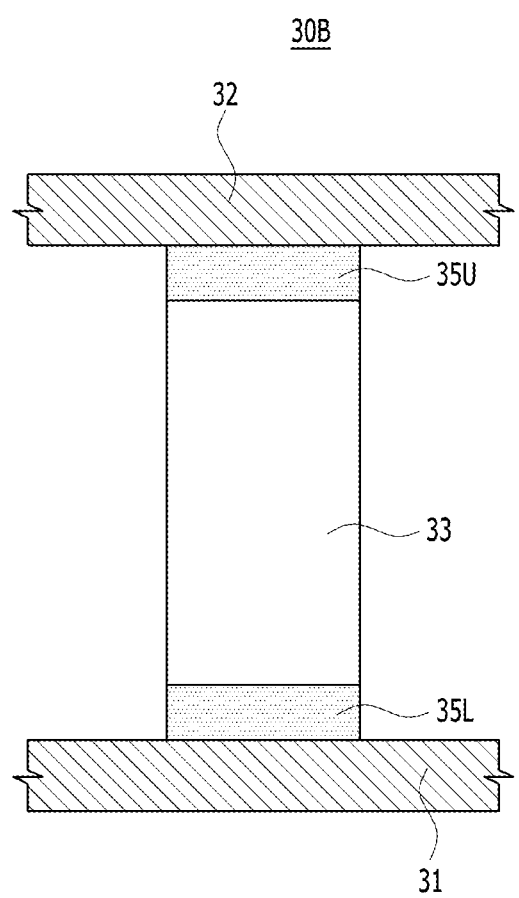

Referring to FIG. 3B, the synapse 30B may further include an upper blocking layer 35U disposed between a top electrode 32 and a variable resistive layer 33, and a lower blocking layer 35L disposed between a bottom electrode 31 and the variable resistive layer 33, compared to the synapse 30A illustrated in FIG. 3A. The upper blocking layer 35U and the lower blocking layer 35L may include a semiconductor material that substantially lacks carrier traps. Each of the upper blocking layer 35U and the lower blocking layer 35L may include two or more materials that are the same as materials of the variable resistive layer 33. The upper blocking layer 35U may block the transfer of carrier traps, atoms, or electrons between the top electrode 32 and the variable resistive layer 33; and the lower blocking layer 35L may block the transfer of carrier traps, atoms, or electrons between the bottom electrode 31 and the variable resistive layer 33.

Figure 3C:
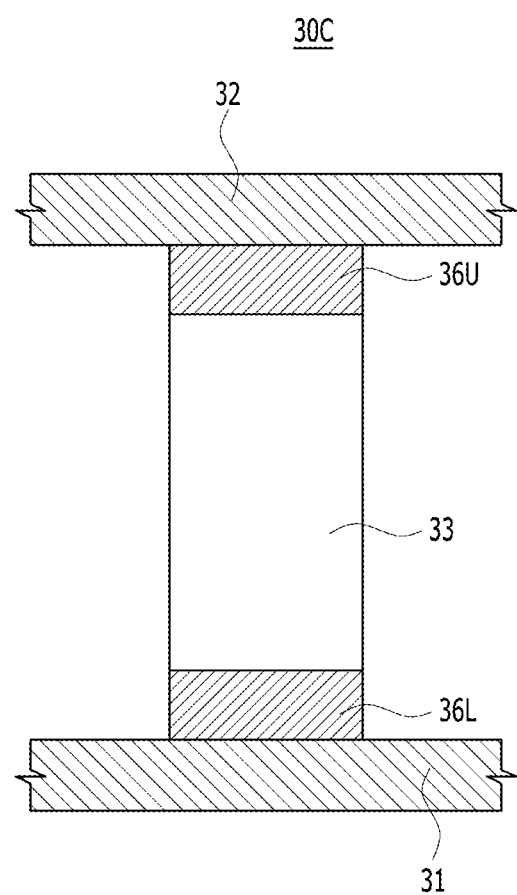

Referring to FIG. 3C, the synapse 30C may further include an upper barrier layer 36U disposed between a top electrode 32 and a variable resistive layer 33, and a lower barrier layer 36L disposed between a bottom electrode 31 and the variable resistive layer 33, compared to the synapse 30A illustrated in FIG. 3A. The upper barrier layer 36U and the lower barrier layer 36L may include Ti, Ta, TiN, TaN, WN, or another barrier material. The upper barrier layer 36U and the lower barrier layer 36L may each include at least one conductive metal or one or more metal compounds.

Figure 3D:
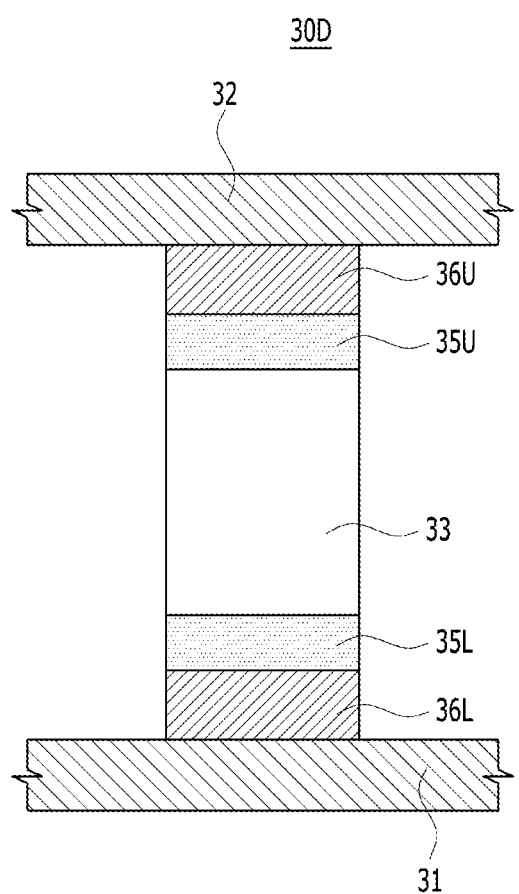

Referring to FIG. 3D, the synapse 30D may further include an upper blocking layer 35U and an upper barrier layer 36U that are disposed between a top electrode 32 and a variable resistive layer 33, and may further include a lower blocking layer 35L and a lower barrier layer 36L that are disposed between a bottom electrode 31 and the variable resistive layer 33, compared to the synapse 30A illustrated in FIG. 3A.

FIGS. 4A to 4E are conceptual energy band diagrams of a synapse of a neuromorphic device in accordance with an embodiment. FIGS. 4A to 4E show the configuration of the synapse 30D illustrated in FIG. 3D. However, embodiments are not limited thereto. In other embodiments, any of the configurations of the synapses 30A to 30C illustrated in FIGS. 3A to 3C may be used.

Figure 4A:
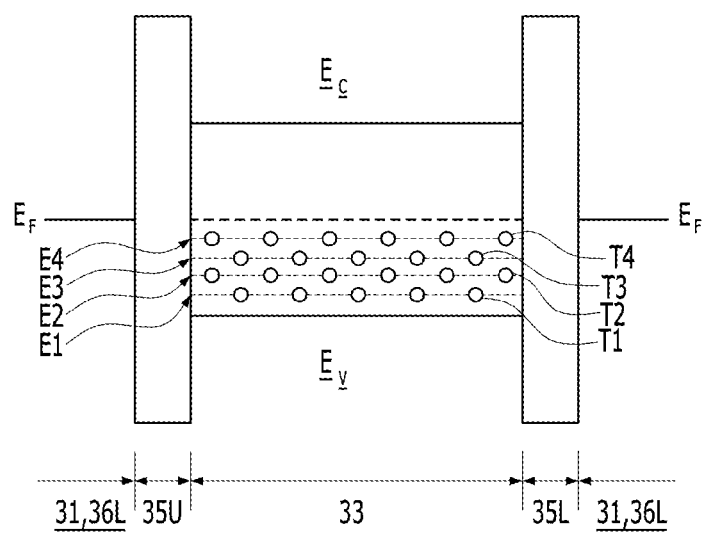
FIGS. 4A to 4E are conceptual energy band diagrams of a synapse of a neuromorphic device in accordance with an embodiment.

Referring to FIG. 4A, the variable resistive layer 33 of the synapse 30D may include a plurality of carrier traps distributed at multiple energy levels when the synapse 30D is not learned or potentiated. For example, the carrier traps may include low carrier traps T1 and T2, distributed at relatively low energy levels E1 and E2, and high carrier traps T3 and T4, distributed at relatively high energy levels E3 and E4. Specifically, referring to FIG. 4A, the carrier traps may include the first carrier traps T1 positioned at the first energy level E1, i.e., the lowest energy level; the second carrier traps T2 positioned at the second energy level E2, i.e., a relatively low energy level; the third carrier traps T3 positioned at the third energy level E3, i.e., a relatively high energy level; and the fourth carrier traps T4 positioned at the fourth energy level E4, i.e., the highest energy level. For convenience of description, the four energy levels E1 to E4 are illustrated in FIG. 4A. However, in other embodiments, a larger or smaller number of energy levels may exist in the variable resistive layer 33 of the synapse 30D. In addition, in another embodiment, the carrier traps T1 to T4 may be physically distributed across various energy levels in a cloud form. Each of the multiple energy levels E1 to E4 may be split into various levels according to materials forming the variable resistive layer 33 and a bonding type of the variable resistive layer 33. The energy levels E1 to E4 may be distributed between the Fermi level $E_F$ and the valence band $E_v$. Therefore, the carrier traps T1 to T4 may also be distributed between the Fermi level $E_F$ and the valence band $E_v$. Since the carrier traps T1 to T4 trap carriers to disturb the transfer of the carriers, the variable resistive layer 33 illustrated in FIG. 4A may have an initial resistance level R0 corresponding to the highest resistance state before a learning process is performed on the synapse 30D.

Figure 4B:
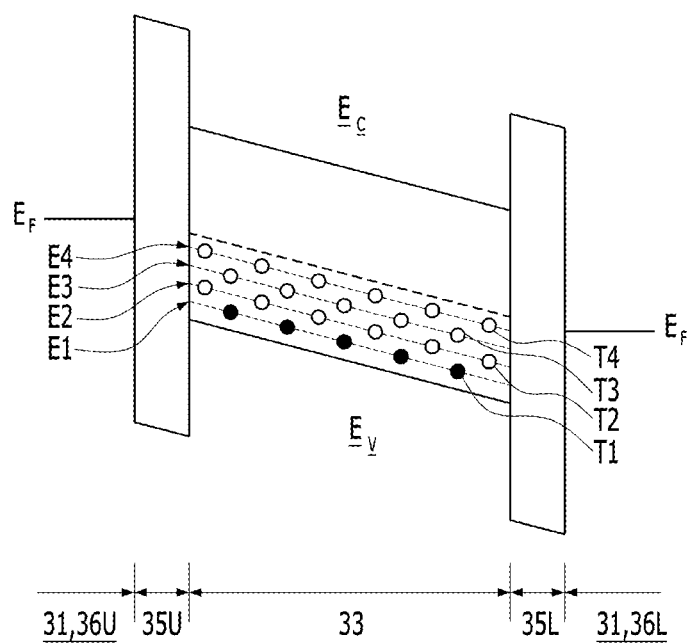

Referring to FIG. 4B, the first carrier traps T1 are filled with carriers when a first learning process is performed on the synapse 30D, and thus the variable resistive layer 33 may have a first resistance level R1 lower than the initial resistance level R0. In other words, the first carrier traps T1 positioned at the first energy level E1 may be substantially filled with carriers, such as electrons, during the first learning process.

Figure 4C:
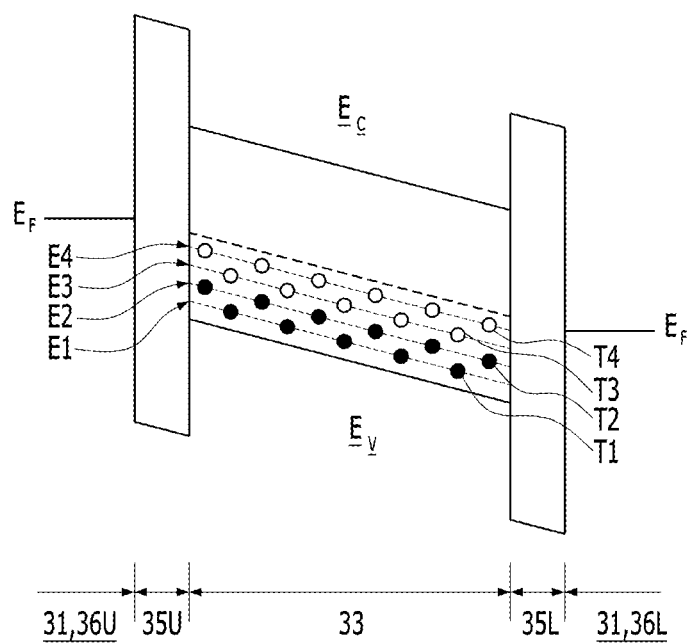

Referring to FIG. 4C, in addition to the first carrier traps T1, the second carrier traps T2 are filled with carriers when a second learning process is performed on the synapse 30D, and thus the variable resistive layer 33 may have a second resistance level R2 lower than the first resistance level R1. In other words, the second carrier traps T2 positioned at the second energy level E2 may be substantially filled with carriers, for example, electrons, during the second learning process.

Figure 4D:
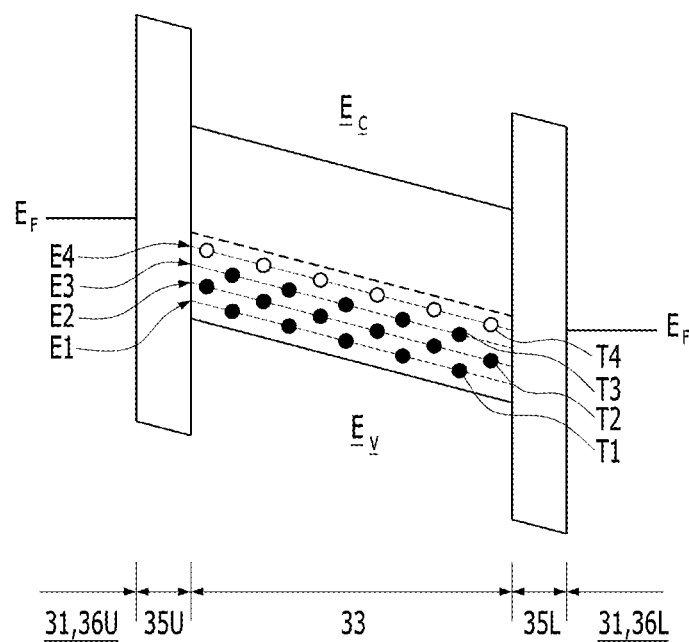

Referring to FIG. 4D, in addition to the first and second carrier traps T1 and T2, the third carrier traps T3 are filled with carriers when a third learning process is performed on the synapse 30D, and thus the variable resistive layer 33 may have a third resistance level R3 lower than the second resistance level R2. In other words, the third carrier traps T3 positioned at the third energy level E3 may be substantially filled with carriers, for example, electrons, during the third learning process.

Figure 4E:
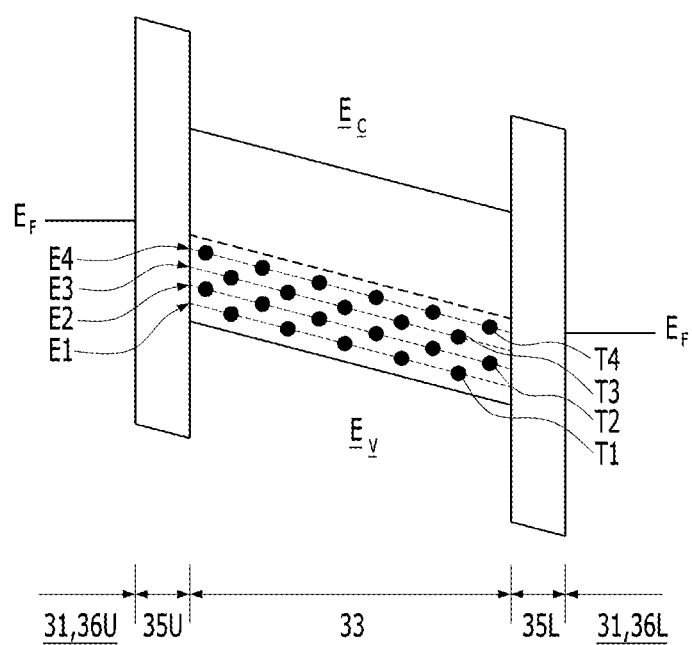

Referring to FIG. 4E, in addition to the first, second, and third carrier traps T1, T2, and T3, the fourth carrier traps T4 are filled with carriers when a fourth learning process is performed on the synapse 30D, and thus the variable resistive layer 33 may have a fourth resistance level R4 lower than the third resistance level R3. In other words, the fourth carrier traps T4 positioned at the fourth energy level E4 may be substantially filled with carriers, for example, electrons, during the fourth learning process.

Referring to FIGS. 4A to 4E, the carrier traps T1 to T4 in the variable resistive layer 33 in accordance with the embodiment may be sequentially filled with carriers as the first to fourth learning processes are performed. That is, a resistance level of the variable resistive layer 33 may be gradually changed depending on the number of electrical pulses input to the synapse 30D. As the number of learning processes performed on the synapse 30D increases, that is, the number of electrical pulses input to the synapse 30D increases, the carrier traps T1 to T4 in the variable resistive layer 33 may trap more carriers. That is, the carrier traps T1 to T4 may be gradually charged. As the carrier traps T1 to T4 in the variable resistive layer 33 are gradually charged, the resistance level of the variable resistive layer 33 may gradually decrease. That is, with the increase of the number of learning processes performed on the synapse 30D, the resistance level of the variable resistive layer 33 may gradually decrease (R0>R1>R2>R3>R4).

Figure 5A:
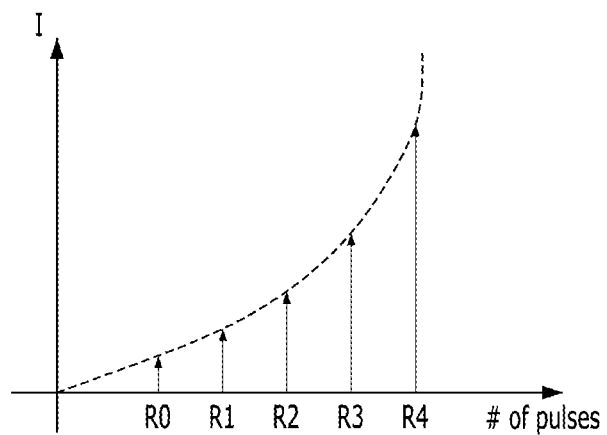
FIGS. 5A to 5C are graphs illustrating current changes according to the change of a resistance level of a variable resistive layer in a neuromorphic device in accordance with an embodiment.
Figure 5B:
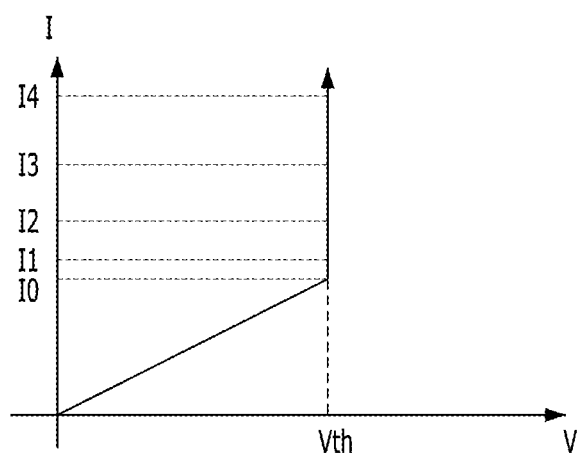
Figure 5C:
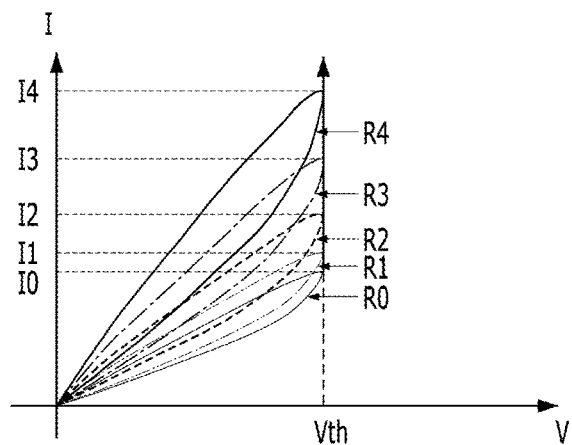

FIGS. 5A to 5C are graphs illustrating current changes according to the change of the resistance level of the variable resistive layer 33 of the neuromorphic device in accordance with the embodiment described with reference to FIGS. 4A to 4E.

In FIG. 5A, an X-axis indicates the number of electrical pulses applied to the variable resistive layer 33 that corresponds to the number of learning processes, and a Y-axis indicates the magnitude of a current flowing through the variable resistive layer 33. Referring to FIG. 5A, the resistance level of the variable resistive layer 33 of the neuromorphic device in accordance with the embodiment gradually lowers with the increase of the number of learning processes (R0-R4). That is, with the increase of the number of electrical pulses applied to the variable resistive layer 33, the resistance level of the variable resistive layer 33 may decrease, such that the current flowing through the variable resistive layer 33 increases.

In each of the graphs illustrated by FIGS. 5B and 5C, the X-axis indicates the magnitude of a voltage, and the Y-axis indicates the magnitude of a current. Referring to FIG. 5B, the variable resistive layer 33 of the neuromorphic device in accordance with the embodiment may have high current values I1 to I4 at the same threshold voltage Vth, with the increase of the number of learning processes performed on the synapse.

Referring to FIG. 5C, a current characteristic of the variable resistive layer 33 of the neuromorphic device in accordance with the embodiment may exhibit hysteresis curves according to the learning states of the synapse, that is, the resistance levels R0 to R4 of the variable resistive layer 33.

Figure 6A:
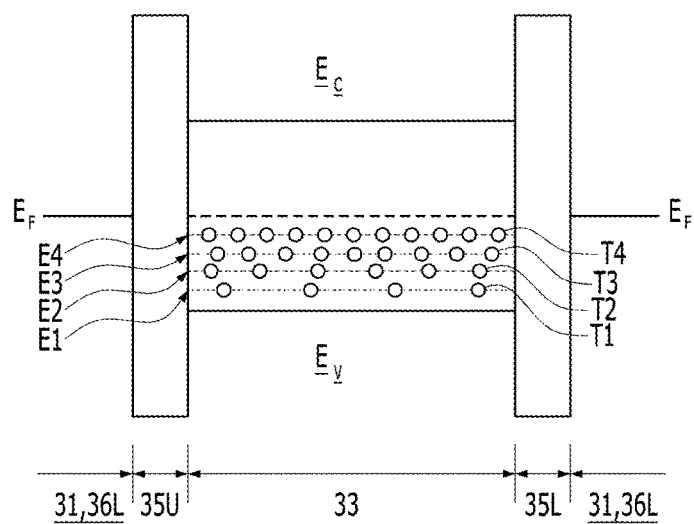
FIG. 6A is a conceptual energy band diagram of a synapse of a neuromorphic device in accordance with an embodiment.
Figure 6B:
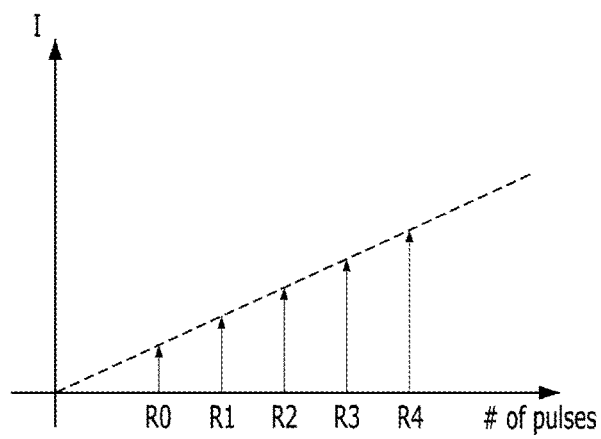
FIG. 6B is a graph illustrating a resistance change of the synapse of the neuromorphic device shown in FIG. 6A.

FIG. 6A is a conceptual energy band diagram of a synapse 30 of a neuromorphic device in accordance with an embodiment, and FIG. 6B is a graph illustrating a resistance level change of the synapse 30 of FIG. 6A.

Referring to FIG. 6A, the synapse 30 of the neuromorphic device in accordance with the embodiment may include carrier traps T1 to T4 distributed at multiple energy levels E1 to E4, respectively, and the carrier traps T1 to T4 may have different densities. For example, the first carrier trap T1 may have the lowest density, and the fourth carrier trap T4 may have the highest density (D1<D2<D3<D4), where D1 to D4 represent the densities of the first to fourth carrier traps T1 to T4, respectively.

Referring to FIGS. 4B to 4E, the carrier traps T1 to T4 of the variable resistive layer 33 in accordance with the embodiment may be sequentially filled with carriers as the number of learning processes performed on the synapse 30D increases. That is, with the increase of the number of learning processes performed on the synapse 30D, the resistance level of the variable resistive layer 33 may gradually decrease.

Referring to FIG. 6B, the resistance level of the variable resistive layer 33 of the neuromorphic device, in accordance with the embodiment, may gradually decrease with the increase of the number of learning processes performed on the synapse 30, and thus the resistance level of the variable resistive layer 33 may linearly change according to density differences among the carrier traps T1 to T4. That is, a linear current change may be obtained according to the density differences among the carrier traps T1 to T4.

Specifically, FIG. 5A illustrates that the resistance level change by the carrier traps T3 and T4 positioned at relatively high energy levels E3 and E4 is relatively large. Thus, when the densities D3 and D4 of the carrier traps T3 and T4, positioned at the relatively high energy levels E3 and E4, are raised and/or the densities D1 and D2 of the carrier traps T1 and T2, positioned at the relatively low energy levels E1 and E2, are lowered as illustrated in FIG. 6A, the corresponding resistance level change may be reduced as illustrated in FIG. 6B. As a result, the current change may also be reduced according to the reduced resistance level change.

Therefore, the densities of the carrier traps T3 and T4 corresponding to the resistance levels R3 and R4 which are sensitively changed depending on the number of learning processes may be raised to desensitize the changes of the resistance levels R3 and R4 and the current change accordingly. That is, referring to FIG. 6B, the resistance level and current of the variable resistive layer 33 may be linearly changed by adjusting the densities of the carrier traps T1 to T4, when the number of learning processes increases, i.e., the number of applied electrical pulses is increased.

Figure 7:
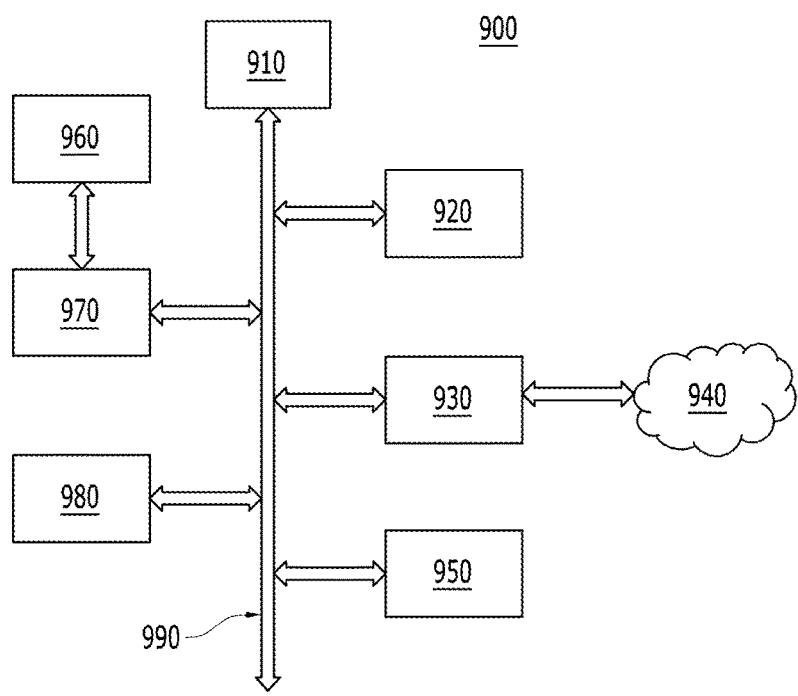
FIG. 7 is a block diagram conceptually illustrating a pattern recognition system in accordance with an embodiment.

FIG. 7 is a block diagram conceptually illustrating a pattern recognition system 900 in accordance with an embodiment. For example, the pattern recognition system 900 may include one of a speech recognition system, an image recognition system, a code recognition system, a signal recognition system, and a system for recognizing various patterns.

Referring to FIG. 7, the pattern recognition system 900 in accordance with the embodiment may include a central processing unit (CPU) 910, a memory unit 920, a communication control unit 930, a network 940, an output unit 950, an input unit 960, an analog-digital converter (ADC) 970, a neuromorphic unit 980, and a bus 990. The CPU 910 may generate and transmit various signals for a learning process to be performed by the neuromorphic unit 980, and perform a variety of processes and functions for recognizing patterns such as speech and images according to an output of the neuromorphic unit 980.

The CPU 910 may be connected to the memory unit 920, the communication control unit 930, the output unit 950, the ADC 970, and the neuromorphic unit 980 through the bus 990.

The memory unit 920 may store information in accordance with operations of the pattern recognition system 900. The memory unit 920 may include one or more of a volatile memory device such as DRAM or SRAM, a nonvolatile memory device such as PRAM, MRAM, ReRAM, or NAND flash memory, and a memory unit such as an HDD (Hard Disk Drive) and a SSD (Solid State Drive).

The communication control unit 930 may transmit and/or receive data such as a recognized speech and image to and/or from a communication control unit of another system through the network 940.

The output unit 950 may output the data such as the recognized speech and image using various methods. For example, the output unit 950 may include one or more of a speaker, a printer, a monitor, a display panel, a beam projector, a hologrammer, and so on.

The input unit 960 may include one or more of a microphone, a camera, a scanner, a touch pad, a keyboard, a mouse, a mouse pen, a sensor, and so on.

The ADC 970 may convert analog data transmitted from the input unit 960 into digital data.

The neuromorphic unit 980 may perform learning and recognition using the data transmitted from the ADC 970, and output data corresponding to a recognized pattern. The neuromorphic unit 980 may include one or more of the neuromorphic devices in accordance with the various embodiments.

In accordance with the embodiments, since the synapse of the neuromorphic device has a plurality of carrier traps distributed at the multiple energy levels, the synapse may have multiple resistance levels and multiple current changes according to the learning states thereof.

Although various embodiments have been described for illustrative purposes, it will be apparent to those skilled in the art that various changes and modifications may be made without departing from the spirit and scope of the invention as defined in the following claims.

What is claimed is:

1. A neuromorphic device having a synapse, the synapse comprising:
   a top electrode;
   a bottom electrode; and
   a variable resistive layer disposed between the top electrode and the bottom electrode,
   wherein the variable resistive layer comprises a plurality of carrier traps distributed at multiple energy levels.

2. The neuromorphic device of claim 1, further comprising an upper blocking layer disposed between the top electrode and the variable resistive layer.

3. The neuromorphic device of claim 2, wherein the upper blocking layer comprises a semiconductor material that substantially lacks carrier traps.

4. The neuromorphic device of claim 1, further comprising a lower blocking layer disposed between the bottom electrode and the variable resistive layer.

5. The neuromorphic device of claim 4, wherein the lower blocking layer and the variable resistive layer comprise two or more of the same materials.

6. The neuromorphic device of claim 1, further comprising an upper barrier layer disposed between the top electrode and the variable resistive layer.

7. The neuromorphic device of claim 6, wherein the upper barrier layer comprises one or more of titanium (Ti), tantalum (Ta), titanium nitride (TiN), tantalum nitride (TaN), tungsten nitride (WN), and another barrier material.

8. The neuromorphic device of claim 1, further comprising a lower barrier layer disposed between the bottom electrode and the variable resistive layer.

9. The neuromorphic device of claim 1, wherein the variable resistive layer comprises two or more of silicon (Si), germanium (Ge), gallium (Ga), indium (In), arsenic (As), stibium (Sb), hafnium (Hf), tantalum (Ta), titanium (Ti), zirconium (Zr), lanthanum (La), vanadium (V), chrome (Cr), manganese (Mn), rubidium (Ru), strontium (Sr), yttrium (Y), niobium (Nb), molybdenum (Mo), ruthenium (Ru), iridium (Ir), aluminum (Al), silicon-germanium ($Si_xGe_y$), and an oxide thereof.

10. The neuromorphic device of claim 1, wherein the plurality of carrier traps comprise charge traps or dangling bonds at an interface between two or more materials, or dangling bonds in an amorphous material.

11. The neuromorphic device of claim 1, wherein the plurality of carrier traps comprise low carrier traps and high carrier traps, the low carrier traps being distributed at relatively low energy levels among the multiple energy levels, the high carrier traps being distributed at relatively high energy levels among the multiple energy levels.

12. The neuromorphic device of claim 11, wherein a density of the high carrier traps is higher than a density of the low carrier traps.

13. The neuromorphic device of claim 1, wherein the plurality of carrier traps are distributed between the Fermi level and the valence band.

14. A neuromorphic device comprising:
   a row line;
   a column line; and
   a synapse disposed between the row line and the column line,
   wherein the synapse comprises a variable resistive layer and a blocking layer in direct contact with the variable resistive layer, and
   wherein the variable resistive layer comprises a semiconducting material having a plurality of carrier traps distributed at multiple energy levels.

15. The neuromorphic device of claim 14, wherein the plurality of carrier traps correspond to defects based on an atomic combination within the variable resistive layer.

16. The neuromorphic device of claim 14, wherein the blocking layer comprises two or more materials that are the same as materials of the variable resistive layer.

17. The neuromorphic device of claim 14, further comprising a barrier layer in direct contact with the blocking layer.

18. The neuromorphic device of claim 17, wherein each of the row line, the column line, and the barrier layer comprise a conductive material having at least one of metals or metal compounds.

19. The neuromorphic device of claim 14, wherein the plurality of carrier traps comprise low carrier traps and high carrier traps, the low carrier traps being distributed at relatively low energy levels among the multiple energy levels, the high carrier traps being distributed at relatively high energy levels among the multiple energy levels.

20. The neuromorphic device of claim 19, wherein a density of the high carrier traps is higher than a density of the low carrier traps.

* * * * *